United States Patent
Bayat et al.

(10) Patent No.: US 10,891,080 B1
(45) Date of Patent: Jan. 12, 2021

(54) MANAGEMENT OF NON-VOLATILE MEMORY ARRAYS

(71) Applicant: MENTIUM TECHNOLOGIES INC., Santa Barbara, CA (US)

(72) Inventors: Farnood Merrikh Bayat, Goleta, CA (US); Mirko Prezioso, Goleta, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 93 days.

(21) Appl. No.: 16/430,885

(22) Filed: Jun. 4, 2019

Related U.S. Application Data

(60) Provisional application No. 62/680,480, filed on Jun. 4, 2018.

(51) Int. Cl.
| | |
|---|---|
| *G06F 3/06* | (2006.01) |
| *H03M 1/74* | (2006.01) |
| *G11C 7/10* | (2006.01) |
| *H03K 3/023* | (2006.01) |
| *G11C 27/02* | (2006.01) |

(52) U.S. Cl.
CPC .......... *G06F 3/0659* (2013.01); *G06F 3/0604* (2013.01); *G06F 3/0688* (2013.01); *G11C 7/1096* (2013.01); *G11C 27/02* (2013.01); *H03K 3/023* (2013.01); *H03M 1/74* (2013.01)

(58) Field of Classification Search
CPC .... G06F 3/0659; G06F 3/0604; G06F 3/0688; G11C 7/1096; G11C 27/02; H03K 3/023; H03M 1/74
See application file for complete search history.

(56) References Cited

U.S. PATENT DOCUMENTS

| | | | | |
|---|---|---|---|---|
| 7,751,253 B2 * | 7/2010 | Sarin | .................. | G11C 16/0483 365/185.22 |
| 7,800,951 B2 * | 9/2010 | Sutardja | .................. | G11C 11/56 365/185.19 |
| 8,023,334 B2 * | 9/2011 | Hoei | ...................... | G11C 16/10 365/185.24 |
| 9,076,547 B2 * | 7/2015 | Moschiano | ......... | G11C 11/5628 |
| 2017/0337466 A1 | 11/2017 | Bayat et al. | | |

FOREIGN PATENT DOCUMENTS

WO      2018201060 A1     11/2018

* cited by examiner

*Primary Examiner* — Vanthu T Nguyen
(74) *Attorney, Agent, or Firm* — Maschoff Brennan

(57) ABSTRACT

The system may include a digital-to-analog converter configured to convert a digital signal to an analog signal. The system may include sample/hold circuits configured to receive and store the analog signal. The system may include an address controller configured to regulate which sample/hold circuits propagate the analog signal. The sample/hold circuits may be configured to feed the analog signal to devices of a memory array. The system may include an output circuit configured to program the devices by comparing currents of the devices to a target current. In response to one or more of the currents of the devices being within a threshold range, the output circuit may discontinue programming the corresponding devices. In response to one or more of the currents of the devices not being within the threshold range, the output circuit may continue programming the corresponding devices.

1 Claim, 12 Drawing Sheets

MANAGEMENT OF NON-VOLATILE MEMORY ARRAYS

CROSS-REFERENCE TO RELATED APPLICATION

This patent application claims the benefit of and priority to U.S. Provisional App. No. 62/680,480 filed Jun. 4, 2018 titled "FAST-PROGRAMMABLE HIGH-SPEED ANALOG SIGNAL PROCESSING MODULE BASED ON NONVOLATILE MEMORY ARRAYS," which is incorporated in the present disclosure by reference in its entirety.

FIELD

The embodiments discussed in the present disclosure are related to management of non-volatile memory arrays.

BACKGROUND

Computing devices are important in many industries. Non-volatile memory is an important component of many computing devices. The speed at which data can be written to and read from memory is an important factor in the speed of many computing devices.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

One or more embodiments of the present disclosure may include a system. The system may include a memory array. The memory array may include devices. The system may also include a digital-to-analog. The digital-to-analog converter may be configured to convert a digital signal to an analog signal as a voltage signal. In addition, the system may include sample and hold circuits. The sample and hold circuits may be configured to receive the analog signal and store the analog signal as a charge. Further, the system may include an address controller. The address controller may be configured to regulate which sample and hold circuits propagate the analog signal. The sample and hold circuits may be configured to feed the analog signal to the devices. The system may include an output circuit. The output circuit may be configured to program the devices by comparing currents of the devices to a target current. In response to one or more of the currents of the devices being within a threshold range of the target current, the output circuit may discontinue programming the corresponding devices. In response to one or more of the currents of the devices not being within the threshold range of the target current, the output circuit may continue programming the corresponding devices. The system may also include a counter. The counter may be configured to generate a counter signal. Further, the system may include output digital-to-analog converters. The output digital-to-analog converters may be configured to generate current signals based on the counter signal. The system may include comparators. The comparators may be configured to receive and compare the current signals based on the counter signal and the currents of the devices. In response to one or more of the currents of the devices being within a threshold of the current signals based on the counter signal, the comparators may be configured to change a sign of one or more corresponding signals generated by the comparators. The system may also include registers. The registers may be configured to receive the signals output by the comparators. In response to the sign of one or more corresponding signals output by the comparators changing, the corresponding registers may store a corresponding signal output by the comparators.

The object and advantages of the embodiments will be realized and achieved at least by the elements, features, and combinations particularly pointed out in the claims. Both the foregoing general description and the following detailed description are exemplary and explanatory and are not restrictive.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
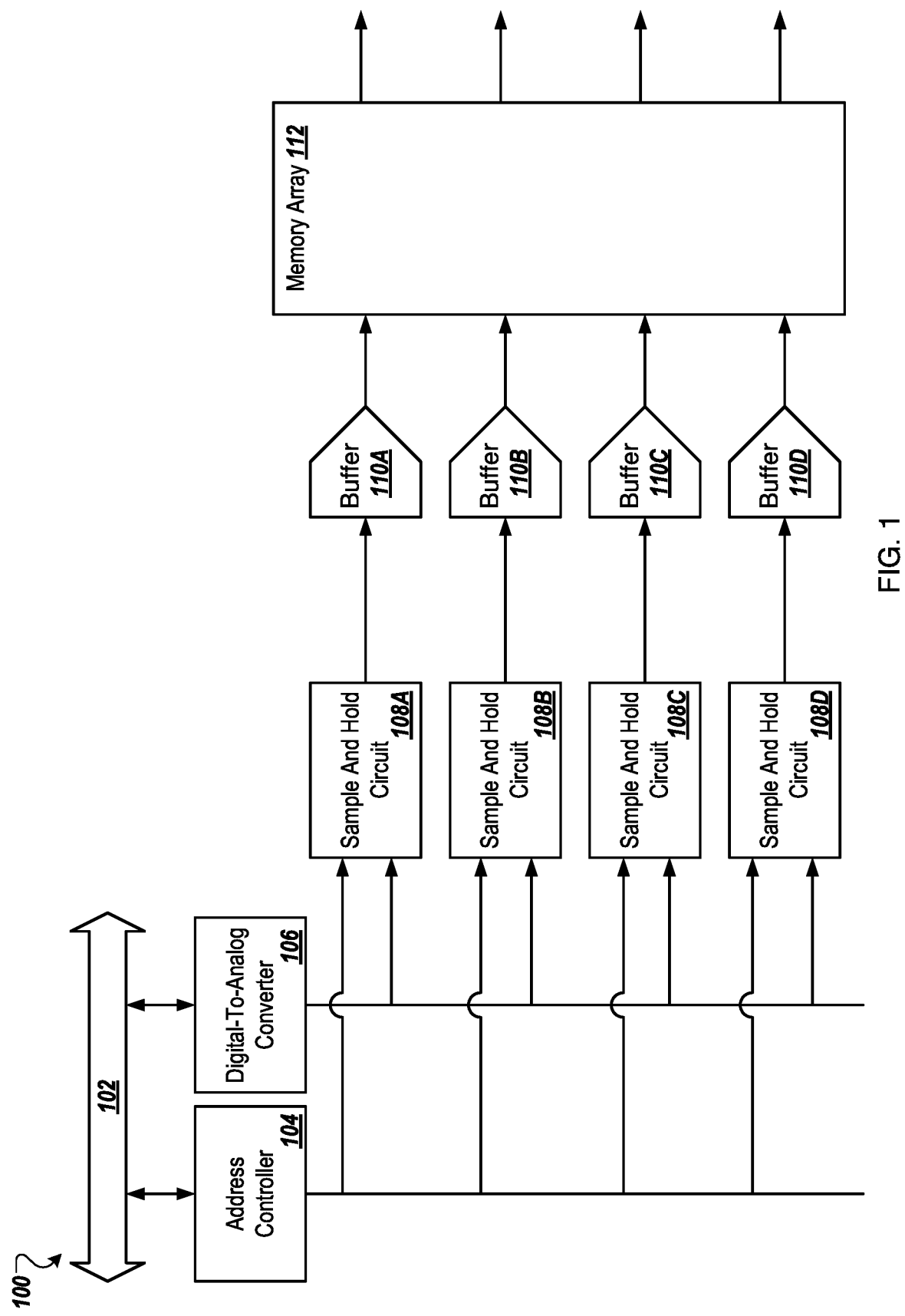
FIG. 1 illustrates an example signal feeding system.

Some memory array technologies may permit accurate feeding of a signal or signals to one or more devices included in a memory array. Meanwhile, some analog memory array technologies may permit fast feeding of one or more devices included in the memory array. These memory array technologies may not be capable of simultaneously performing accurate and fast feeding of the signal to the devices included in the memory array. In addition, some memory array technologies may consume large amounts of power to quickly feed the signals to the devices included in the memory array. Some memory array technologies may include a large circuit footprints to accurately feed the signals to the devices included in the memory array. For example, some memory array technologies may include a digital-to-analog converter (DAC) for each row and/or column of the memory array to feed the signals to each device included in the memory array. In addition, some memory array technologies may include an analog-to-digital converter (ADC) for each row and/or column of the memory array to read current of signals coming out of the memory array. Some memory arrays may include a memory array that includes five hundred or more rows and five hundred or more columns, which may use five hundred or more DACs to convert digital input signals to appropriate analog signals to feed to the devices in the memory array and may use five hundred or more ADCs to convert current of device or devices in the memory array from analog to digital. Including a DAC or ADC for each row and/or column in the memory array may cause the circuit footprint of the memory array and the circuits used to operate the memory array to be large and power hungry.

According to various embodiments described in this disclosure, a single DAC may provide one or more analog signals to one or many sample and hold (SH) circuits. The DAC may convert the digital signal to an analog signal. Each SH circuit may be electrically coupled to the DAC and a different row of devices of the memory array. The SH circuits may receive and store (e.g., hold) a charge that is equivalent to the voltage of the analog signal that may be used as the input signal for the corresponding row of devices. In some embodiments, each of the SH circuits may include a capacitor and a switch device that may include a smaller circuit footprint relative to DACs. Each of the SH circuits receiving the analog signal from the DAC may permit the feeding the analog signal of the devices in the memory array to be accurate enough for analog systems and within an appropriate amount of time.

The speed of accessing (e.g., reading to and/or writing from) memory may be a factor in the speed and/or efficiency of computing devices. In some cases, the speed of accessing the memory may be a bottleneck in the overall speed of a computing system. Systems and methods of the present disclosure may improve the speed and/or efficiency of accessing and/or programming memory.

Memory arrays may be used to perform different operations, (e.g., analog signal processing operations including vector-by-matrix multiplication). In some memory arrays, devices in the memory array may be programmed with an analog signal. In other memory arrays, devices in the memory array may be programmed with a digital signal. The precision of the programming of the memory arrays may be different depending on several factors specific to the memory arrays. In addition, sequential programming of the devices in the memory array may be time consuming due to the large number of devices in the memory array (e.g., the number of devices may be thousands).

Moreover, because of device-to-device and cycle-to-cycle variations in the arrays, Model-based tuning of the memory arrays may be inefficient due to device-to-device and cycle-to-cycle variations. In some embodiments, each device may be programmed using a single programming pulse applied to each device. In these and other embodiments, a current on each device may be measured. If the current on the devices is not within a threshold range from the target current, an additional programming pulse may be provided to the devices. This process may be repeated until the current of the device is within the threshold range of the target current. The width and/or amplitude of the programming pulses may be modified to change how quickly current of the devices approaches the target current. Smaller and/or narrower pulses may increase a number of steps used to reach the target current, which may cause the programming to be slower but more accurate.

If during programming the current of the device moves far away from the target current, the direction of programming may be changed by using other sets of pulses (for example by changing the polarity of the programming pulse in the case of memristive arrays or using erasure pulses in the case of flash memory arrays).

In memory array technologies that implement parallel programming, measuring the current of all of the devices in the memory array at the same time rather than reading their states individually after the application of each pulse may be difficult to perform. Systems and methods of the present disclosure may include memory array technologies that measure the current of all devices in a single (or multiple) row of the memory array at the same time, which may increase the speed of programming the memory array compared to measuring the current of each individual device in the memory array. In some embodiments, similar techniques and devices may be used for reading the outputs of the computing systems based on NVM memory array technologies during the operation phase.

In some embodiments, the memory array may be configured such that a programming pulse may be applied to all devices of the memory array located in a single row or column of the memory array. Additionally or alternatively, the memory array may be configured such that the current of all of the devices may be read at the same time by applying a read bias signal to the multiple devices. Additionally or alternatively, nonvolatile states of all or parts of the devices of the row or column may be moved in a particular direction together, for example, the stored charge on the floating gates of all of the devices of a row may be increased or decreased at the same time. If one or more of the devices reach the target current, the programming for these devices may be stopped. For example, if a particular device of a row of a memory array is fully programmed, the particular device may cease to be changed while other devices of the same row continue to be programmed. Additionally or alternatively, in some embodiments, it may be possible to erase or fully set/reset all devices on the row or column at the same time and then gradually program or erase all of the devices in the row or column until all devices reach their corresponding targets (unidirectional programming).

Memory arrays may include several hundreds to thousands of output lines. The number of output lines being great may limit a speed at which the output signals may be read.

The systems and methods of the present disclosure be used for different types of memory devices, e.g. flash memory, memristive memory, phase change memory (PCM), etc.

These and other embodiments of the present disclosure will be explained with reference to the accompanying figures. In the figures, features with like numbers indicate like structure and function unless described otherwise.

FIG. 1 illustrates an example signal feeding system 100 (referred to in the present disclosure as "system 100") that may be implemented for a memory array 112 that is configured to receive a voltage signal. The system 100 may include an address and data bus 102 (referred to in the present disclosure as "bus 102"), an address controller 104, single or multiple digital-to-analog-converters 106 (referred to collectively in the present disclosure as "DACs 106" or individually as "DAC 106"). The system 100 may also include multiple sample and hold circuits 108A, 108B, 108C, 108D (referred to collectively in the present disclosure as "SH circuits 108" or individually as "SH circuit 108"). Further, the system 100 may include multiple buffers 110A, 110B, 110C, 110D (referred to collectively in the present disclosure as "buffers 110" or individually as "buffer 110") and the memory array 112. The system 100 may be configured to operate such that the memory array 112 receives an analog signal as a voltage signal.

Each input line of the memory array 112 may electrically couple the buffers 110 to a corresponding row of devices in the memory array 112. The devices of the memory array are described in more detail below in relation FIG. 5. The memory array 112 may include a flash memory, a memristor memory, or any other appropriate non-volatile memory that is configured to receive a voltage signal. Each of the SH circuits 108 may include a capacitor and a switch device. Each of the switch devices in the SH circuits 108 may include a field effect transistor (FET) that includes a gate, a source, and a drain. The gate of the FETs in the SH circuits 108 may be electrically coupled to the address controller 104.

The address controller 104 may receive an address message on the bus 102. The address message may indicate which SH circuits 108 are to be provided the analog signals and which SH circuits 108 are not to be provided the analog signal. The address controller 104 may provide electrical signals to the SH circuits 108 that are to be provided the analog signals. For example, the address controller 104 may provide the electrical signals at a voltage level sufficient to cause the corresponding FETs in the SH circuits 108 that are to receive the analog signal to transition from a non-propagating state to a propagating state. As discussed below, the SH circuits 108 may be used to store the inputs of the memory array 112.

The DACs 106 may receive digital signals from the bus 102. The DACs 106 may convert the digital signals to the analog signals. The analog signals may include the voltage signal. In addition, one or more of the SH circuits 108 may receive the analog signal from the DACs 106 based on the electrical signals received by the SH circuits 108 from the address controller 104. The SH circuits 108 that receive the analog signals may provide the analog signals to the corresponding capacitors. The capacitors may store (e.g., hold) a charge equivalent to a voltage level of the analog signal. For a period of time, the capacitors may provide the stored analog signals to the corresponding buffers 110. The period of time capacitors need to store the analog signals accurately may correspond to a minimum amount of time to perform a corresponding multiplication, an accuracy level, available chip area, and/or an amount of time to measure output signals of the memory array 112. The buffers 110 may buffer the analog signals and provide the analog signals as a buffered analog signal to the corresponding rows of devices in the memory array 112. In some embodiments, the buffers 110 may be omitted and the capacitors in the SH circuits 108 may provide the analog signals directly to the corresponding rows of devices in the memory array 112.

The SH circuits 108 that are not receiving the analog signal from the DAC 106 may provide an analog signal to the corresponding row of devices equivalent to the charge stored on the corresponding capacitors if the capacitors previously stored a charge.

In some embodiments, the DAC 106 may include a single DAC circuit and the DAC 106 may provide the analog signal serially to the SH circuits 108. For example, SH circuit 108A may be in the propagating state and the DAC 106 may provide a first portion of the analog signal at a first voltage and SH circuit 108A may hold the first portion of the analog signal. As another example, the SH circuit 108B may be in the propagating state and the DAC 106 may provide a second portion of the analog signal at a second voltage level or at the first voltage level and SH circuit 108B may hold the second portion of the analog signal. Alternatively, the DAC 106 may include multiple DAC circuits operating in parallel. The DAC circuits operating in parallel may provide different analog signals to different SH circuits 108. The DAC 106 including multiple DAC circuits may permit faster operation, shorter periods of time for the SH circuits 108 to hold the analog signal, and the capacitors of the SH circuits 108 may be smaller. Additionally, the address controller 104 may include a single output and may provide the electrical signal serially for different SH circuits 108. Alternatively, the address controller 104 may include multiple outputs that operate in parallel.

In some embodiments, one or more of the SH circuits 108 may also include compensating circuits. In some embodiments, the capacitors in the SH circuits 108 may be configured to compensate for leakage or the charge injected to the capacitor during switching. For example, the capacitors may be rated to store a charge that is relatively greater than an expected undesired injected charge. In these and other embodiments, a capacitance of the capacitors may be based on leakage, injected charges, gate leakage of the FETs, and accuracy at the output of the memory array 112.

In some embodiments, one or more of the SH circuits 108 may include multiple capacitors and switch devices. The SH circuits 108 including multiple capacitors and switch devices may increase an accuracy of the voltage level being provided to the corresponding rows of devices in the memory array 112. This configuration may compensate for the charge being stored in the capacitors while the switch devices are switching. Additionally or alternatively, the DAC 106 may be capable of driving the capacitors in the SH circuits 108 to charge the capacitors at a high speed. In these and other embodiments, the capacitors in the SH circuits 108 may be rated for a higher capacitance which may cause the SH circuits 108 to not compensate for injected charges.

Modifications, additions, or omissions may be made to FIG. 1 without departing from the scope of the present disclosure. For example, the system 100 may include more or fewer elements than those illustrated and described in the present disclosure. Moreover, although described separately, in some embodiments, two or more of the address controller 104 may be part of a same system or module or divided differently than described. The delineation between these and other elements in the description is not limiting and is meant to aid in understanding and explanation of the concepts and principles used in the present disclosure.

Figure 2:
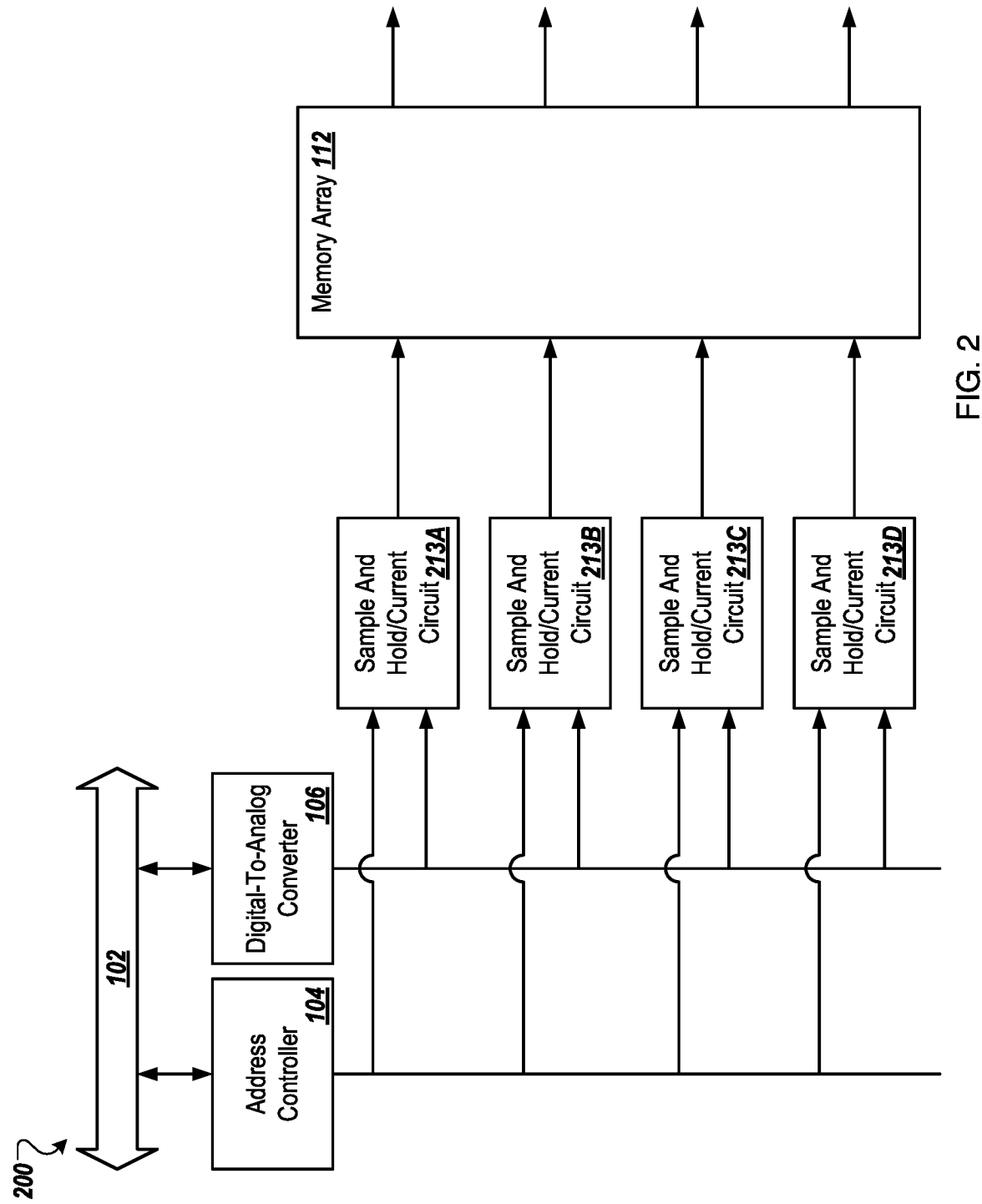
FIG. 2 illustrates another example signal feeding system.

FIG. 2 illustrates another example signal feeding system 200 (referred to in the present disclosure as "system 200") that may be implemented for the memory array 112. The system 200 may include multiple sample and hold/current circuits 213A, 213B, 213C, 213D (referred to collectively in the present disclosure as "SHC circuits 213" or individually as "SHC circuit 213").

The DAC 106 may be configured to convert the electrical signal to the analog signal as a current signal. The SHC circuits 213 may receive the analog signal as the current signal. The SHC circuits 213 may convert the analog signal to a voltage signal. In some embodiments, the SHC circuits 213 may convert the analog signal to a voltage signal using a converter such as converter 860 described below in reference to FIGS. 8A and 8B. In addition, the SHC circuits 213 may store the converted analog signal similar to the SH circuits 108 discussed above. Further, the SHC circuits 213, after storing the converted analog signal, may be configured to convert the analog signal back to the current signal. The SHC circuits 213 may provide the analog signal as the current signal to the input line and the corresponding rows of devices the memory array 112.

In some embodiments, the SHC circuits 213 may include current mirrors or any other appropriate current converter. In these and other embodiments, the SHC circuits 213 may include a current mirror such as current mirror 700 described below in relation to FIG. 7. In some embodiments, the SHC circuits 213 may be configured to convert the analog signal from the current signal to the voltage signal linearly or non-linearly.

Modifications, additions, or omissions may be made to FIG. 2 without departing from the scope of the present disclosure. For example, the system 200 may include more or fewer elements than those illustrated and described in the present disclosure. Moreover, although described separately, in some embodiments, two or more of the address controllers 104 may be part of a same system or module or divided differently than described. The delineation between these and other elements in the description is not limiting and is meant to aid in understanding and explanation of the concepts and principles used in the present disclosure.

Figure 3:
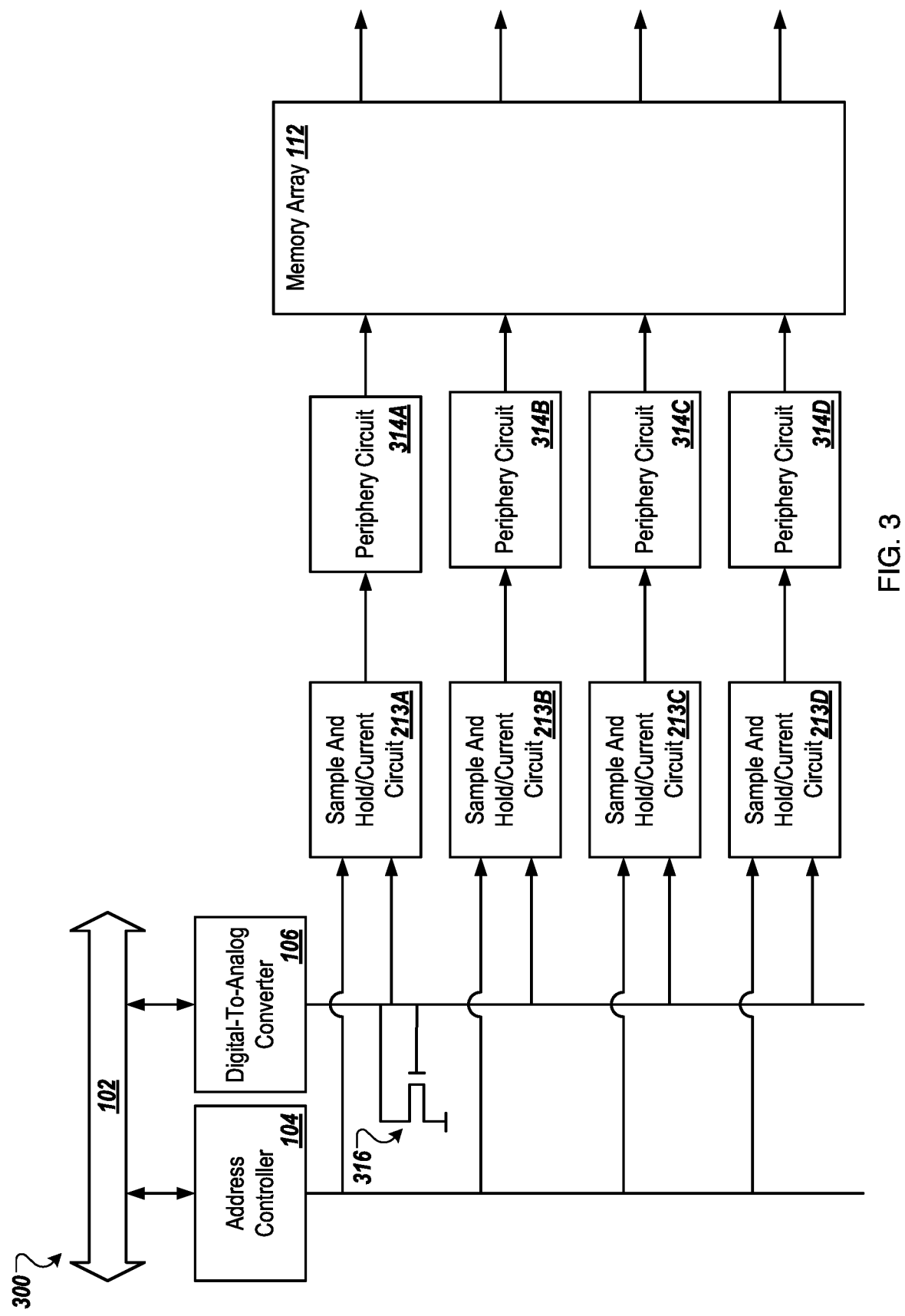
FIG. 3 illustrates yet another example signal feeding system.

FIG. 3 illustrates yet another example signal feeding system 300 (referred to in the present disclosure as "system 300") that may be implemented for the memory array 112. The system 300 may include multiple periphery circuits 314A, 314B, 314C, 314D (referred to collectively in the present disclosure as "periphery circuits 314" or individually as "periphery circuit 314").

In the embodiment illustrated in FIG. 3, the SHC circuits 213 may include current mirrors. In some embodiments, the current mirrors may be P-type metal-oxide-semiconductor (PMOS) or N-type metal-oxide-semiconductor (NMOS) current mirrors. The SHC circuits 213 may receive the analog signal as a current signal and convert the analog signal to a voltage signal. In some embodiments, the SHC circuits 213 may convert the analog signal to the voltage signal logarithmically. Each of the SHC circuits 213 may store the analog signal as the voltage signal as a charge on the corresponding capacitors as discussed above. In some embodiments, the SHC circuits 213 may convert the analog signal back to a current signal. In some embodiments, a second transistor in the current mirrors included in the SHC circuits 213 may receive and convert the charge from the capacitors continuously and equal to the current of the analog signal received by the SHC circuits 213.

In some embodiments, the SHC circuits 213 may be configured to compensate for mismatch of the transistors in the current mirrors. For example, in some embodiments, the size of the transistors may be increased. As another example, the mismatch compensation may be performed for only the transistors in the current mirrors. In some embodiments, a first transistor of the current mirror may be physically close to a second transistor of the current mirror and the mismatch may be relatively small. In other embodiments, the first transistor of the current mirror may be separate from the SHC circuits 213 (this is illustrated in FIG. 3 as transistor 316). In these embodiments, the first transistor may be physically located far from the second transistor included in the SHC circuits 213 and the mismatch may be relatively large. In the embodiments where the first transistor is shared between all of the SHC circuits 213 (e.g., the embodiment in which the first transistor is positioned like transistor 316 in FIG. 3), the circuit footprint of the system 300 may be relatively smaller since there is only a single first transistor compared to embodiments in which each of the SHC circuits 213 includes the first transistor. In the embodiments where the first transistor is shared, the voltage generated by the shared first transistor may be buffered before being electrically connected to SHC circuits 213.

In some embodiments, the mismatch compensation may be performed for each of the transistors or a portion of the transistors in the SHC circuits 213. In some embodiments, a capacitance of the capacitors may be based on leakage of pass gates, gates of the transistors, injected charges, injected charges during gate switching, and clock feedthrough from the address controller 104. Additionally or alternatively, the transistors in the current mirrors may be sized properly so the mismatch will be reduced and the intrinsic capacitance of the gates may play the role of the capacitor of the SH.

Leakage of the transistors may be minimized by limiting the number of the SHC circuits 213 that are electrically coupled (e.g., in a propagating state) to the DAC 106 at the same time. In addition, in some embodiments, thick-oxide and high-Vt transistors may be included in the current mirrors to minimize leakage.

In some embodiments, the current mirrors may be configured as cascading current mirrors. In these and other embodiments, injection compensations circuits may be included in the system as discussed above. In some embodiments, each SHC circuit 213 may be electrically coupled to a global erase bus. In these embodiments, before the current mirrors are operational, the global erase bus may provide an electrical signal to each of the SHC circuits 213 to remove any charge stored on the capacitors in the SHC circuits 213. In some embodiments, the periphery circuits 314 may include buffers similar to the buffers 110 of FIG. 1.

Modifications, additions, or omissions may be made to FIG. 3 without departing from the scope of the present disclosure. For example, the system 300 may include more or fewer elements than those illustrated and described in the present disclosure. Moreover, although described separately, in some embodiments, two or more of the address controller 104 and/or the transistor 316 may be part of a same system or module or divided differently than described. The delineation between these and other elements in the description is not limiting and is meant to aid in understanding and explanation of the concepts and principles used in the present disclosure.

Figure 4:
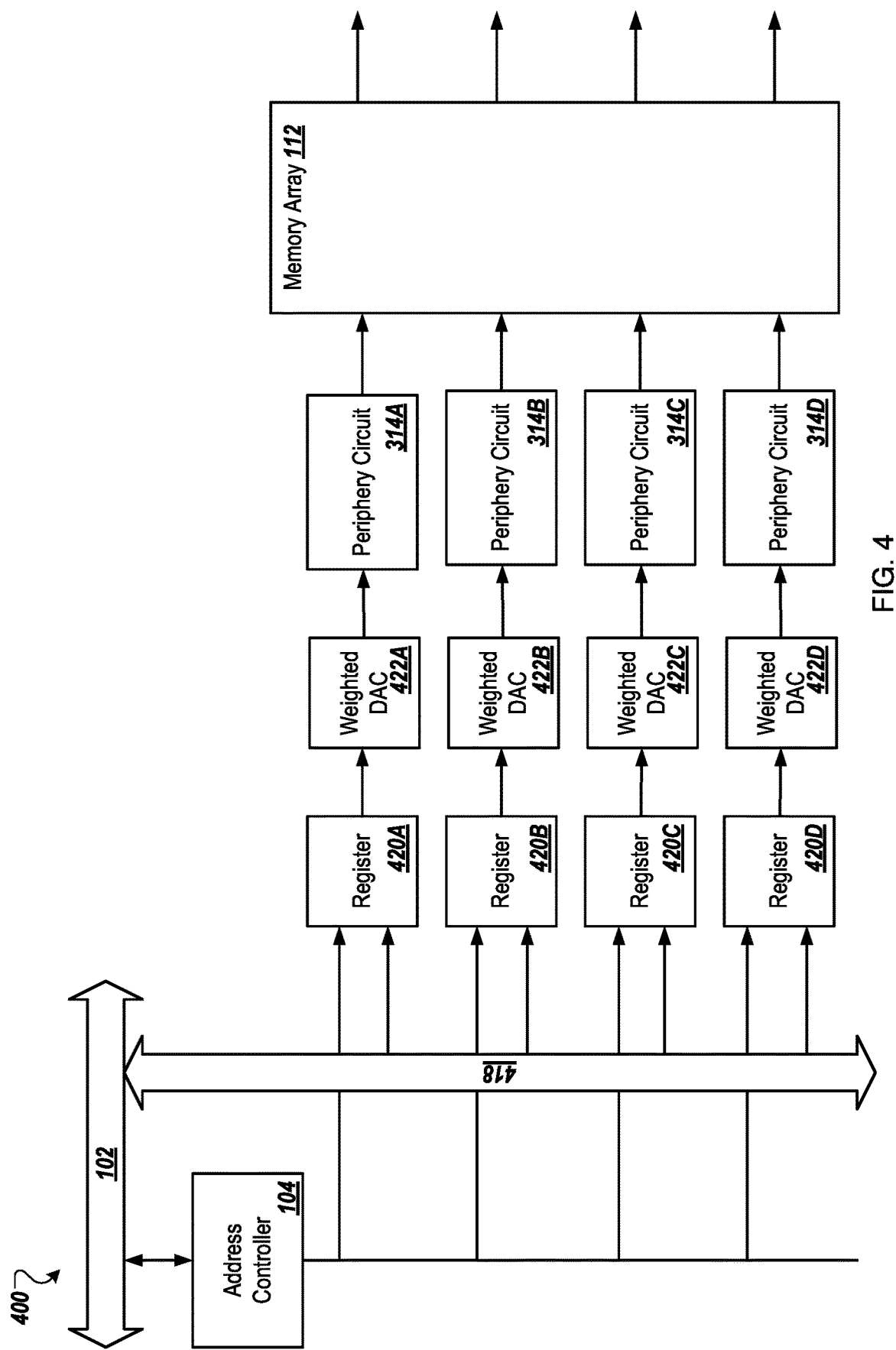
FIG. 4 illustrates an example signal feeding system.

FIG. 4 illustrates an example signal feeding system 400 (referred to in the present disclosure as "system 300") that may be implemented for the memory array 112. The system 400 may include multiple registers 420a, 420B, 420C, 420D (referred to collectively in the present disclosure as "registers 420" or individually as "register 420"), multiple weighted DACs 422A, 422B, 422C, 422D (referred to collectively in the present disclosure as "weighted DACs 422" or individually as "weighted DAC 422"), and a data bus 418. In some embodiments, the registers 420 may provide digital signals to each of the weighted DACs 422. In these and other embodiments, the weighted DACs 422 may include complementary metal-oxide-semiconductor (CMOS) weighted DACs where transistors are sized properly. In some embodiments, data stored in flip flop circuits may be used to configure the weighted DACs 422 to ensure the analog signal output by the weighted DACs 422 is within an appropriate range. In addition, the registers may receive data via the data bus 418.

Modifications, additions, or omissions may be made to FIG. 4 without departing from the scope of the present disclosure. For example, the system 400 may include more or fewer elements than those illustrated and described in the present disclosure. Moreover, although described separately, in some embodiments, two or more of the address controller 104 may be part of a same system or module or divided differently than described. The delineation between these and other elements in the description is not limiting and is meant to aid in understanding and explanation of the concepts and principles used in the present disclosure.

Figure 5:
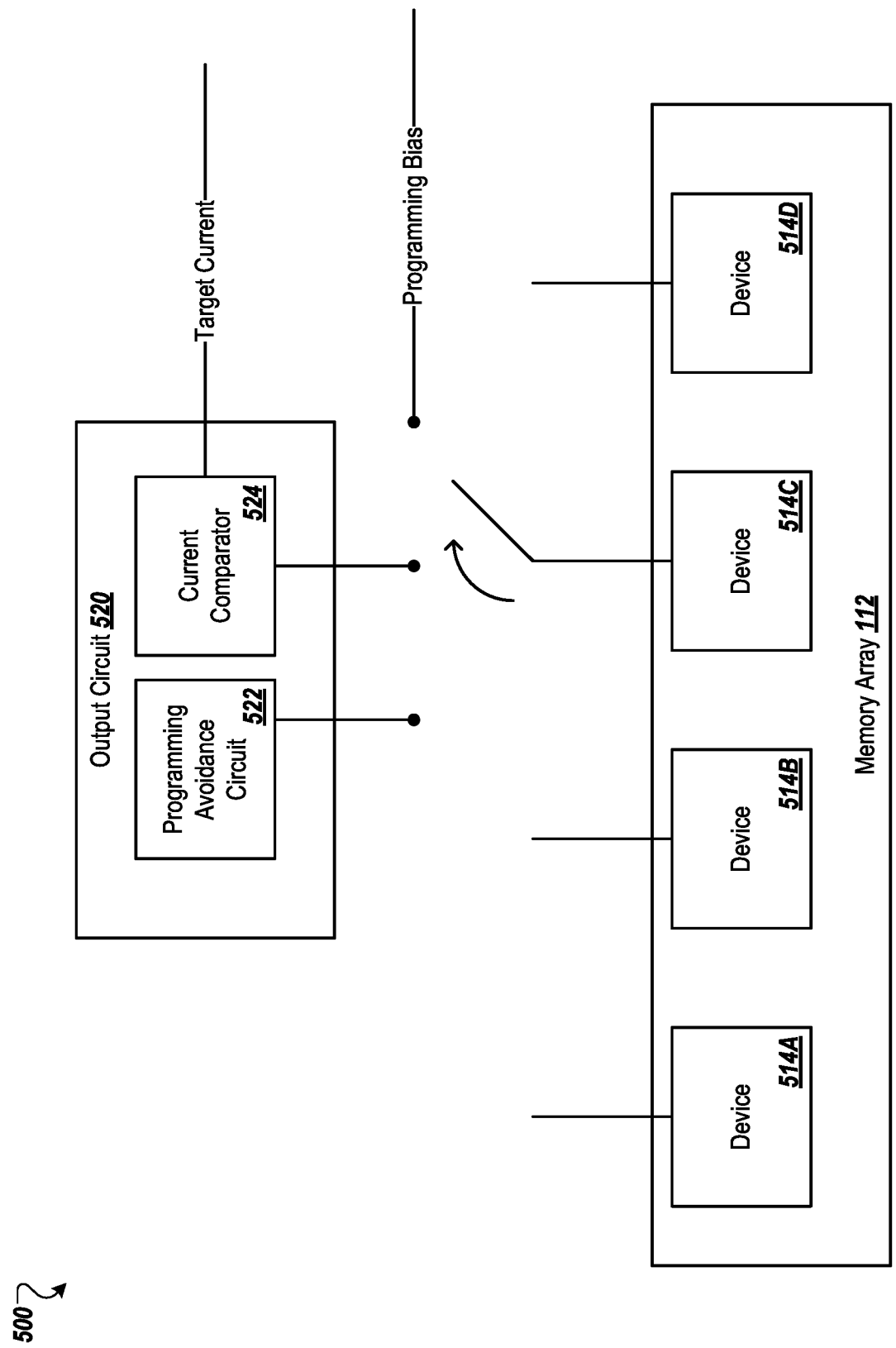
FIG. 5 illustrates an example programming system.

FIG. 5 illustrates an example programming system 500 that may be implemented with the memory array 112. The memory array 112, as illustrated in FIG. 5, includes four devices, a first device 514A, a second device 514b, a third device 514c, and a fourth device 514d (referred to collectively as "devices 514" or individually as "device 514"). The illustration of four devices 514 is for illustrative purposes only. The memory array 112 may include any number of devices in each row, for example, thousands or more devices 514. The system 500 also includes an output circuit 520. The output circuit 520 includes a programming avoidance circuit 522 and a current comparator 524 connected to the columns or rows of the memory array 112. In some embodiments, the system 500 may include any number of output circuits 520. For example, there may be one output circuit for each output column of the memory array 112. In another example, every output circuit may be shared between several output columns of the memory array 112. Additionally or alternatively, there may be one or more output circuit 520 for each column of devices 514 or each row of devices 514 in the memory array 112. For instance there may be one output circuit connected to the first device 514 of a row and another output circuit connected to the last device 514 of a row. The memory array 112 may be the same as or substantially similar to what was described above regarding the memory array 112 of FIGS. 1-4.

In some embodiments, the devices 514 may include transistors configured to store bits of data as a charge, for example, on floating gate transistors. The devices 514 may include single-level cell (SLC) devices. Additionally or alternatively, the devices 514 may include multi-level cell (MLC), triple-level cell (TLC) or quad-level cell (QLC) devices.

In some embodiments, each of the devices 514 or output columns may include or be attached to a switch with may allow the device 514 of a selected row to electrically connect to other contacts in the system 500. For example, a switch on the third column connected to device 514c may allow the third device 514c to connect with one of the programming avoidance circuit 522, the current comparator 524, or the programming bias line.

In some embodiments, the programming bias line may be a line that may be charged. In some embodiments, the programming bias line may be charged with a constant charge. Additionally or alternatively, the programming bias line may be charged by a pulse. In some embodiments, each of the devices 514 may be configured to electrically connect to the programming bias line, thereby charging the nonvolatile state of the devices 514 during programming phase.

In some embodiments, the current comparator 524 may include a circuit configured to compare a current from a device 514 with the target current. The target current may be a current supplied by a current mirror such that the target current does not change despite loading on the line.

In some embodiments, the programming avoidance circuit 522 may be configured such that when one or more devices 514 are connected to it, the devices 514 are not charged with the programming bias. For example, the devices 514 may not have been previously charged or the devices 514 may have been previously discharged. In other embodiments, this may allow the devices 514 to keep its current nonvolatile state when other devices 514 on the same row or column are getting programmed.

In some embodiments, the output circuit 520 may be configured to program one or more of the devices 514. For example, the devices 514 may be connected (e.g., electrically coupled) to the programming bias line, thereby charging the devices 514, (e.g., through a pulse). Thereafter, the devices 514 may be connected to the current comparator 524 which may determine if the current of the devices 514 is within a threshold range. It may be determined that the current of the devices 514 are within the threshold range if the devices 514 provide a current to the current comparator 524 that is within 1 Pico amp and 100 micro amp of a target current. In some embodiments, the threshold range may be based on an amplitude of the target current and the desired accuracy of device programming.

If the current on the devices 514 is within the threshold range, the devices 514 may be connected to the programming avoidance circuit 522. If the current on the devices 514 is not within the threshold range, the devices 514 may be connected to the programming bias line to receive additional charge. For example, the devices 514 may be connected to the programming bias line for the duration of another pulse, after which the devices 514 may be connected to the current comparator 524 again.

In some embodiments, the memory array 112 may be used to perform neural network operations (e.g., the memory array 112 may be used as the synapses of the neural network). Each of the devices 514 in the memory array 112 may be configured to store a weight value (e.g., the programming discussed herein may be configured to provide these weight values to the devices 514) corresponding to a number of electrons on a floating gate of the corresponding devices 514. The devices 514 may multiply signals received as input (e.g., described above in relation FIGS. 1-4) by the corresponding weight value to generate output signals on the output lines. The memory array 112 being used to perform neural network operations is discussed in more detail in U.S. application Ser. No. 15/594,439 titled "DEEP LEARNING NEURAL NETWORK CLASSIFIER USING NON-VOLATILE MEMORY ARRAY" and PCT Application No. WO2018201060A1 titled "MIXED SIGNAL NEUROMORPHIC COMPUTING WITH NONVOLATILE MEMORY DEVICES," which are incorporated in the present disclosure by reference in their entirety.

In some embodiments all of the devices 514 in a single row in the memory array 112 may initially be set to be in a fully erased or programmed (set or reset) state. Thereafter, all of the devices 514 in that row may be connected to the programming bias line and may receive (e.g., at another terminal) the programming pulse to slightly modify the current on all of the devices 514 in that row. Thereafter, each of the devices 514 in that row may receive a reading pulse which may put all of the devices 514 in that row in a reading mode. An amplitude and width of the programming pulse and the reading pulse may be technology dependent. In the reading mode, the current of all the devices 514 in that row may be measured.

In some embodiments, the current of each of the devices 514 in that row may be measured by connecting the different devices 514 in that row to the current comparators 524. In these and other embodiments, if the current of the devices 514 is within the threshold range of the target current or is greater than the target current, programming of the corresponding devices 514 in that row may stop, e.g., the corresponding devices 514 may be connected to the programming avoidance circuit 522. If the current on the devices 514 in that row is not within the threshold range or greater than the target current, all of the devices 514 in that row may be connected to the programming bias line again. This process may be repeated until each of the devices 514 in the memory array 112 is programmed.

In some embodiments, the devices 514 on a selected row may be programmed in parallel with each other. In these embodiments, an output circuit 520 may be included in the system 500 for each output columns the devices 514 are connected to. Alternatively, an output circuit 520 may be included in the system 500 shared between several devices 514 in the memory array 112. In these embodiments, the current on each device 514 may be individually measured and compared to the target current. Increasing the number of output circuits 520 in the system 500 may increase the speed of programming the memory array 112. However, increasing the number of output circuits 520 may increase the circuit footprint of the system 500.

In some embodiments, a weight programming duration for each device 514 may be short (e.g., several microseconds (or shorter) to hundreds of microseconds). Additionally or alternatively, a programming accuracy of the devices 514 may be relatively low (e.g. 2 to 10 bits). In embodiments in which the system 500 includes multiple output circuits 520, each of the output circuits 520 may perform similar tasks, which may permit a single output circuit 520 to be used for programming multiple devices 514.

In some embodiments, if an error exists in the memory array 112 during programming, all of the devices 514 may be erased at the same time and programming of the memory array may start again with less aggressive procedure.

In embodiments, in which a current comparator is used in the system 500, the circuit footprint of the system 500 may be relatively smaller than if the system 500 used an analog-to-digital converter (ADCs) for each output line of the memory array 112, or multiplexing one high-speed ADC between several output lines of the memory array 112, which may be sensitive to transistor and device mismatch. These embodiments may also permit resource sharing and cause a reduction of computation complexity for a processor. Likewise, DACs and SHCs that are the same as or similar to the DACs discussed elsewhere (e.g., DAC 106, SH circuit 108 and weighted DACs 422) may be used in the comparator circuit 600 to generate the target current. The comparator circuit 600 may include any suitable current comparator and any suitable feedback element like transistor, resistor, capacitor or diode. In some embodiments, the comparator circuit 600 may take into account the characteristics of the memory array 112.

Additionally, since one or more devices 514 may require multiple (e.g., 100 or more) pulses to reach the threshold range of the target current, based on the duration of each programming pulse and reading pulse, the size of capacitors included in the SHC circuits of the system 500 to store the target current of each output circuit should be selected based on the number of pulses expected before reaching the threshold range of the target current in all of the devices being programmed. If the size of the capacitors becomes too big, smaller capacitors may be used in the system 500 and charges stored on the capacitors may periodically be refreshed to maintain programming accuracy.

Since all of the devices 514 in a row are being programmed at the same time, and because the devices 514 may include device-to-device and cycle-to-cycle variations, the speed of programming the memory array 112 may be based on the worst device 514 in the memory array 112. Basing the speed of programming the memory array 112 on the worst device 514, may cause smaller or narrower programming pulses to be used, which may cause the current on the devices 514 to slowly move toward the target current. In some embodiments, a number of pulses that may be received by the devices 514 may be greater than the number of pulses the devices 514 may receive in embodiments in which the devices 514 are programmed using model-based algorithms or are programmed individually. However, in these and other embodiments, since hundreds of devices 514 are being programmed at the same time, the total number of pulses seen by each device 514 as well as the total number of pulses used to program the memory array 112 may be fewer than embodiments in which the devices 514 are programmed individually. Further, the amplitude or width of the programming pulse may be increased to increase the speed at which the memory array 112 is programmed.

Modifications, additions, or omissions may be made to FIG. 5 without departing from the scope of the present disclosure. For example, the system 500 may include more or fewer elements than those illustrated and described in the present disclosure. Moreover, although described separately, in some embodiments, two or more of the programming avoidance circuit 522 and the current comparator 524 may be part of a same system or module or divided differently than described. The delineation between these and other elements in the description is not limiting and is meant to aid in understanding and explanation of the concepts and principles used in the present disclosure.

Figure 6:
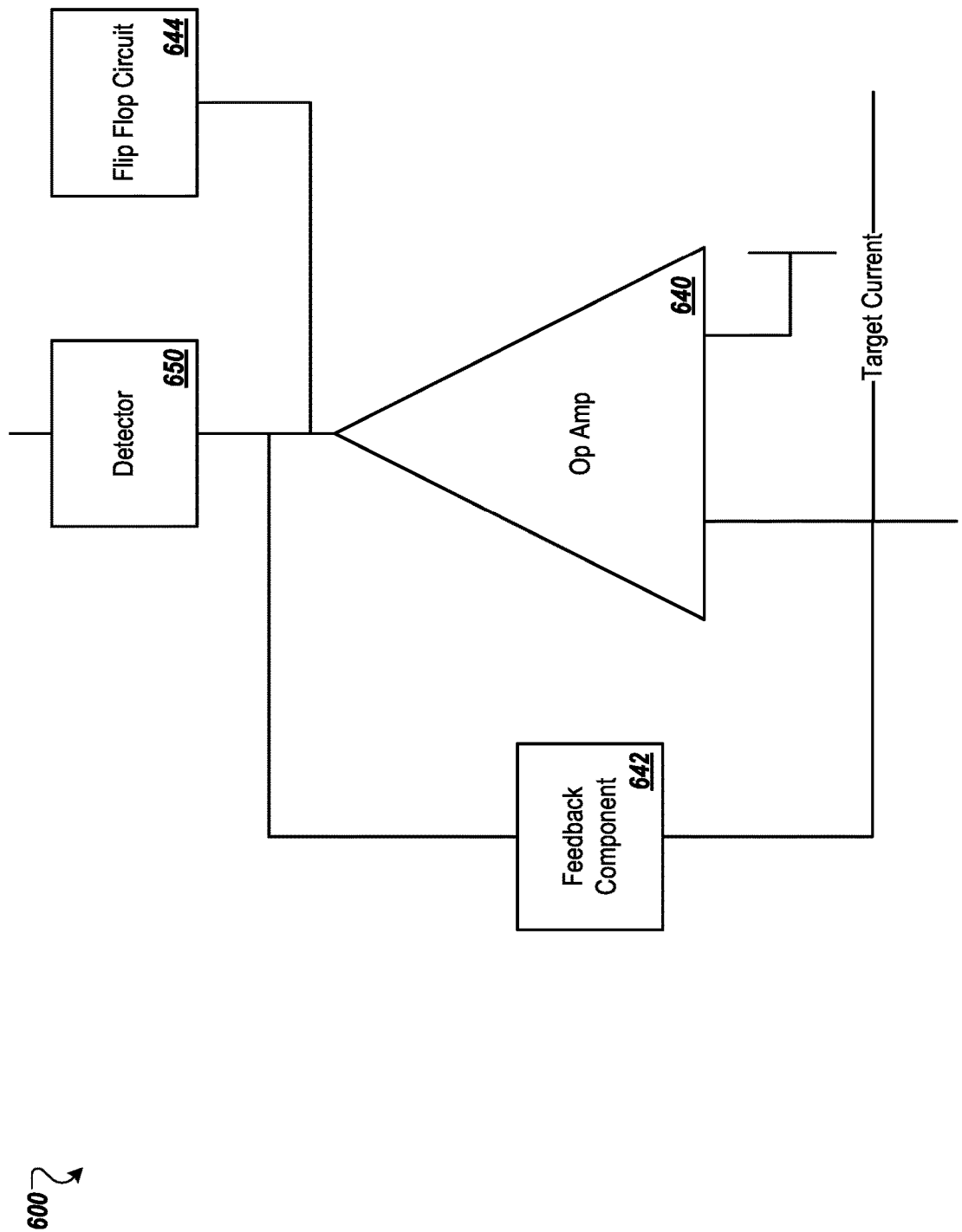
FIG. 6 illustrates an example comparator circuit.

FIG. 6 illustrates an example comparator circuit 600. The comparator circuit 600 may include an operational amplifier (referred to in the present disclosure as "op amp 640"), a feedback component 642, a detector 650, and a flip flop circuit 644. The comparator circuit 600 may be an example of one or more components included in the current comparator 524 of FIG. 5. For example, the comparator circuit 600 may be included in the current comparator 524 to compare current of one or more of the devices 514 to determine if the current on the devices 514 is within the threshold range of the target current.

In some embodiments, the memory array 112 may outputs a voltage signal. In other embodiments, the output signal of the memory array 112 may be converted to a voltage signal, similar circuitry to the comparator circuit 600 may be used to compare the outputs of the memory array 112 using SH circuits. The SH circuits may be the same as or similar to the SH circuits 108 discussed above. Additionally or alternatively, the current comparator 524 may also ensure that the memory array 112 is properly biased during the read mode (e.g. through virtual biasing using op-amps).

In some embodiments, the op amp 640 may include any suitable operational amplifier. In some embodiments, the feedback component 642 may include a component that provides impedance. For example, the feedback component 642 may include a resistor and/or a capacitor. In some embodiments, the feedback component 642 may include multiple sub-components. In some embodiments, the flip flop circuit 644 may include any suitable flip flop circuit. In some embodiments, the detector 650 may include a sign-change detector circuit.

The flip flop circuit 644 may include a D-type flip flop (DFF). In some embodiments, if the output of the comparator switches signs between two programming pulses the output of the detector circuit 650 may become on showing that the corresponding devices 514 are programmed. The detector circuit may then trigger the flip flop to change value. The output of the flip flop circuit 644 may be used to avoid further programming of the programmed devices 514 in the memory array 112 or continue the programming. In some embodiments, the flip flop circuit 644 may be used without the detector when a gain of the op amp 640 is relatively high so the output of the converter 860 can directly trigger the flip flop after the current subtraction changes sign.

The comparator circuit 600 may include capacitors, resistors, transistors, or diodes such that if the current on the devices 514 is larger than the target current, the system may generate negative (or positive) output voltage and when the current is lower than the target current, it will generate positive (or negative) output voltage. This may indicate that the corresponding devices 514 are programmed and further programming is to be avoided. The use of capacitors in the current subtraction may allow current integration for more accurate estimation of the direction of current to be determined but resetting of the feedback capacitor before each reading may be needed.

In some embodiments, an analog target current of each output of the memory array may be stored in a SH circuit 108 or any other appropriate storage device. The target current of each output line of the memory array 112 may be compared to the current of the corresponding output line after each programming pulse to determine if the current of the corresponding output line is within an acceptable range of the stored target current. If the current on the corresponding output line is within the acceptable range of the target current or is lower than the target current, a proper voltage may be applied to the output of that device to avoid further programming of the corresponding device 514. If a signal on output line of the memory array 112 is in the form of voltage (or it is first converted to voltage), other architectures may be used to generate and store the target voltage in the form of voltage on the capacitors in the SH circuits 108 as discussed elsewhere in the present disclosure.

Modifications, additions, or omissions may be made to FIG. 6 without departing from the scope of the present disclosure. For example, the comparator circuit 600 may include more or fewer elements than those illustrated and described in the present disclosure. Moreover, although described separately, in some embodiments, two or more of the detectors 650 and the flip flop circuits 644 may be part of a same system or module or divided differently than described. The delineation between these and other elements in the description is not limiting and is meant to aid in understanding and explanation of the concepts and principles used in the present disclosure.

Figure 7:
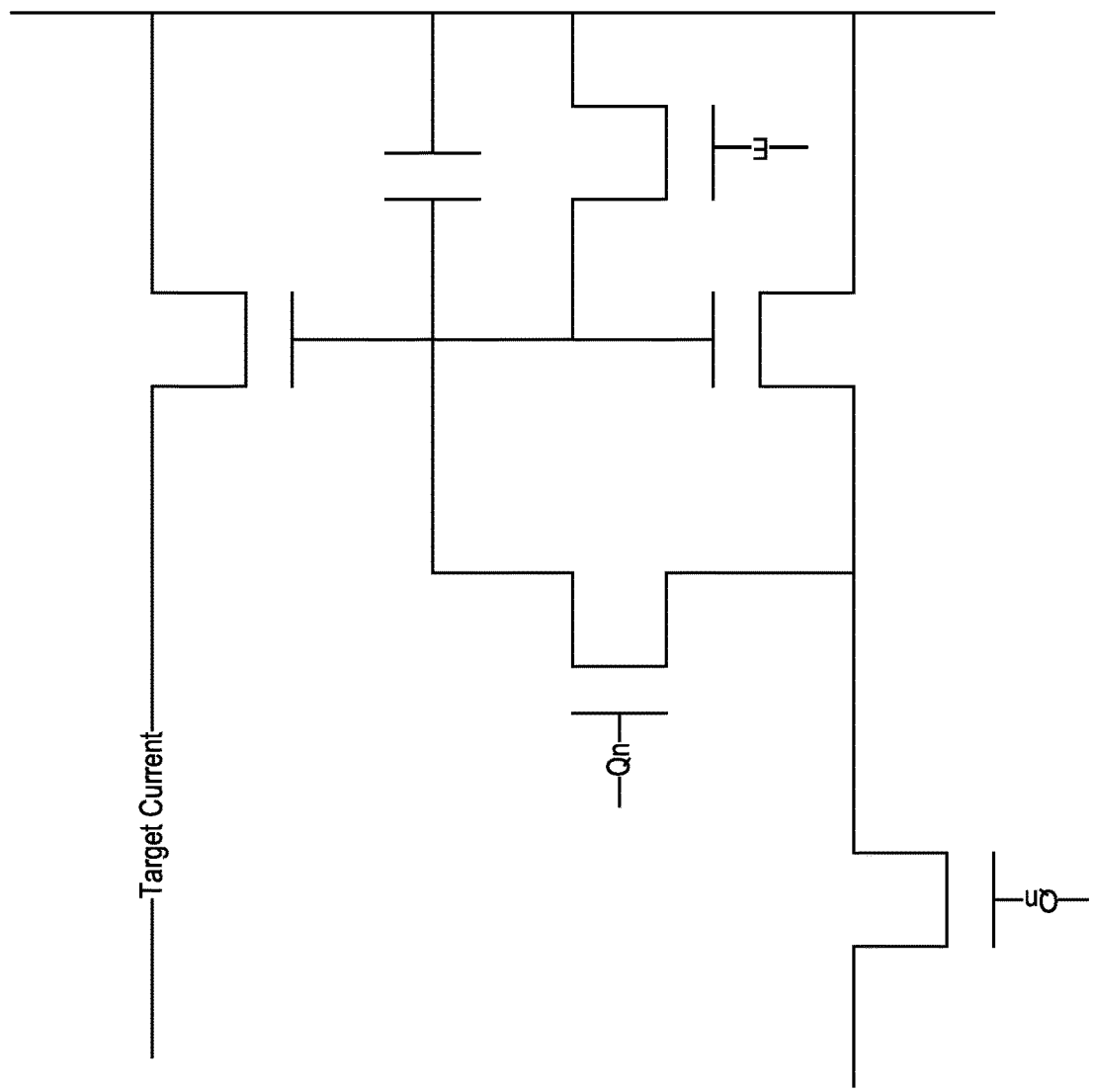
FIG. 7 illustrates an example current mirror.

FIG. 7 illustrates an example current mirror 700 with integrated SH according to at least one embodiment described in the present disclosure. The current mirror 700 may include multiple transistors configured to cause the target current to copy another current present in the current mirror 700. The target current may be independently supplied with power such that regardless of loading of a line supplying the target current, the target current still mirrors the other current.

In some embodiments, the current mirror 700 may be used in connection with the systems 200, 300, 500 of FIGS. 2, 3, and 5. For example, the current mirror 700 may supply the target current to the output circuit 520 in FIG. 5. As another example, the current mirror 700 may be implemented in the SHC circuits 213 of FIGS. 2 and 3. In some embodiments, a binary weighted DAC, or current mirror, may share the first part of the mirror and route the voltage rather than current.

Modifications, additions, or omissions may be made to FIG. 7 without departing from the scope of the present disclosure. For example, the current mirror 700 may include more or fewer elements than those illustrated and described in the present disclosure. Moreover, although described separately, in some embodiments, two or more of the transistors may be part of a same system or module or divided differently than described. The delineation between these and other elements in the description is not limiting and is meant to aid in understanding and explanation of the concepts and principles used in the present disclosure.

Figure 8A:
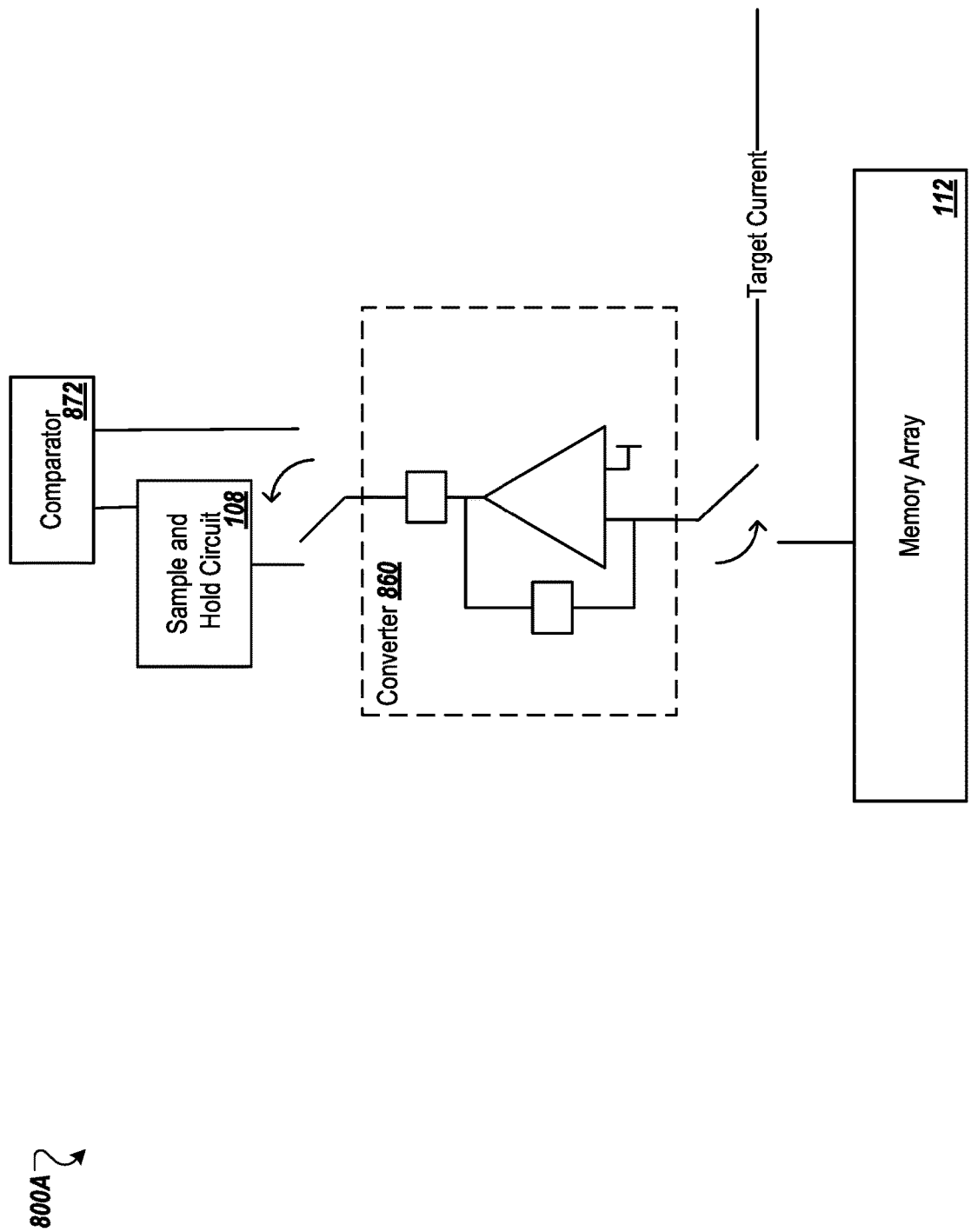
FIG. 8A illustrates an example current comparator system.

FIG. 8A illustrates an example current comparator system 800A that may be implemented with the memory array 112. The current comparator system 800A may include a converter 860 and a comparator 872. In some embodiments, the converter 860 may include any suitable circuit configured to convert a current signal to a voltage signal. In some embodiments, the converter 860 may include an operational amplifier with a feedback component. In some embodiments, the feedback component may include a transistor, diode, capacitor, or resistor. In some embodiments, the comparator 872 may include any suitable circuit configured to compare two input voltages or currents. For example, the comparator 872 may compare a voltage signal received from the SH circuit 108 with an input from the converter 860.

In some embodiments, the target current for each device 514 of the memory array 112 may propagate through the same circuitry connected to the output lines of the memory array 112. In these and other embodiments, the current on the devices 514 of the memory array 112 may be stored in analog form as a voltage signal in the SH circuit 108 after being converted to the voltage signal by the converter 860. The voltage signal may be stored in the SH circuit 108 in the same or similar manner as the analog signal discussed above. The voltage signal based on the current on the output lines of the memory array 112 may be compared with the target voltage stored in the SH circuit 108. If the voltage signal based on the current of an output line is within a particular range of the target voltage, a sign on the comparator 872 may be changed for the read pulse. This may indicate that the devices 514 electrically coupled to the corresponding output line are programmed. In addition, programming for these devices 514 may end.

In some embodiments, the mismatch of devices in the converter 860 (e.g., the feedback component of the converter 860) or their nonlinearity or non-ideal behavior of the op amp in the converter 860 may be negated by the target current and the current on the devices electrically coupled to the output of the memory array 112 both passing through the same circuit (e.g., both are passing through the converter 860).

In some embodiments, a circuit generating target current (e.g., a DAC circuit) may be shared for all outputs, which may reduce the circuit footprint. In some embodiments, devices other than resistors and transistors may be used as the feedback element of the converter 860 which may further reduce the circuit footprint of the current comparator system 800A.

Modifications, additions, or omissions may be made to FIG. 8A without departing from the scope of the present disclosure. For example, the current comparator system 800A may include more or fewer elements than those illustrated and described in the present disclosure. Moreover, although described separately, in some embodiments, two or more of the SH circuits 108 and the comparator 872 may be part of a same system or module or divided differently than described. The delineation between these and other elements in the description is not limiting and is meant to aid in understanding and explanation of the concepts and principles used in the present disclosure.

Figure 8B:
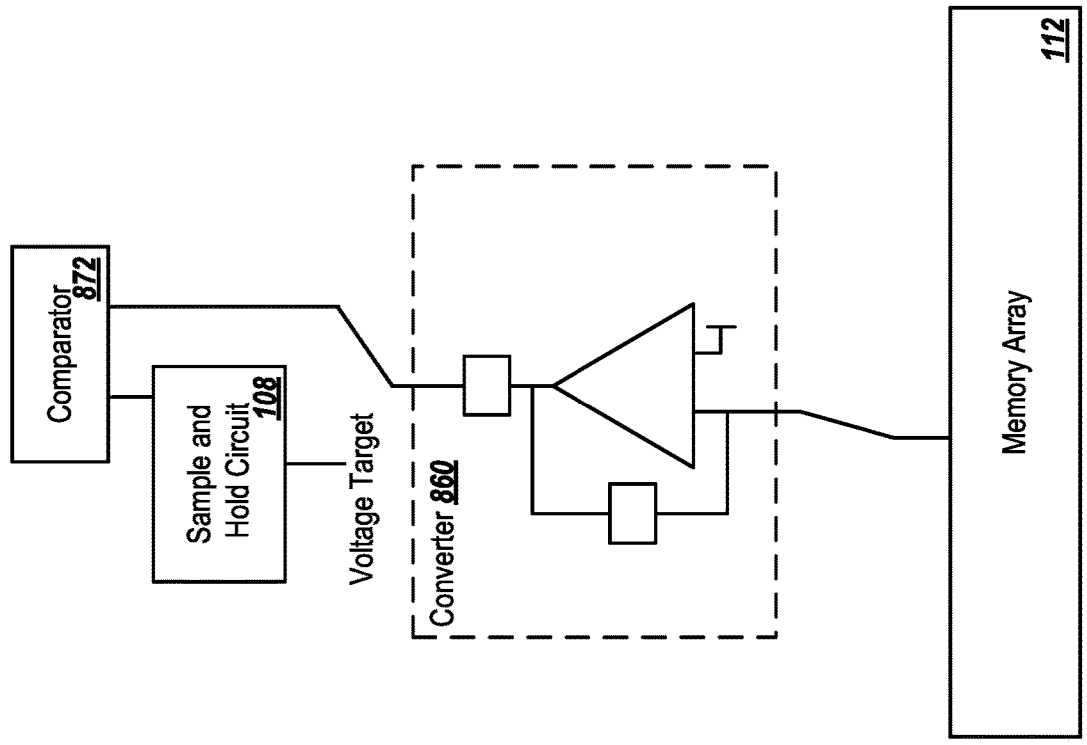
FIG. 8B illustrates another example current comparator system.

FIG. 8B illustrates another example current comparator system 800B that may be implemented with the memory array 112. In the example of comparator system 800B the converter 860 may include a resistor with a known resistance as the feedback element. Because the exact resistance of the feedback element (e.g., the resistance of the resistor) is known, weights which the devices 514 in the memory array 112 will be programmed to may be modified to compensate for a mismatch of the resistor. In these and other embodiments, instead of programming the memory array 112 using original weights for each column of devices in the memory array 112, the modified weights may be used for each column of devices in the memory array 112. In some embodiments, the mismatch of the resistor may be compensated for by further modifying the weights of the current on the devices 514. In these and other embodiments, the converter 860 may be used to convert the output current of the devices 514 in the memory array 112 to voltage, which may be measured by an ADC. In some embodiments, an ADC may be used for each output of the memory array 112. In other embodiments, a single ADC may be multiplexing between several outputs of the memory array 112.

Modifications, additions, or omissions may be made to FIG. 8B without departing from the scope of the present disclosure. For example, the current comparator system 800B may include more or fewer elements than those illustrated and described in the present disclosure. Moreover, although described separately, in some embodiments, two or more of the SH circuits 108 and the comparator 872 may be part of a same system or module or divided differently than described. The delineation between these and other elements in the description is not limiting and is meant to aid in understanding and explanation of the concepts and principles used in the present disclosure.

Figure 9:
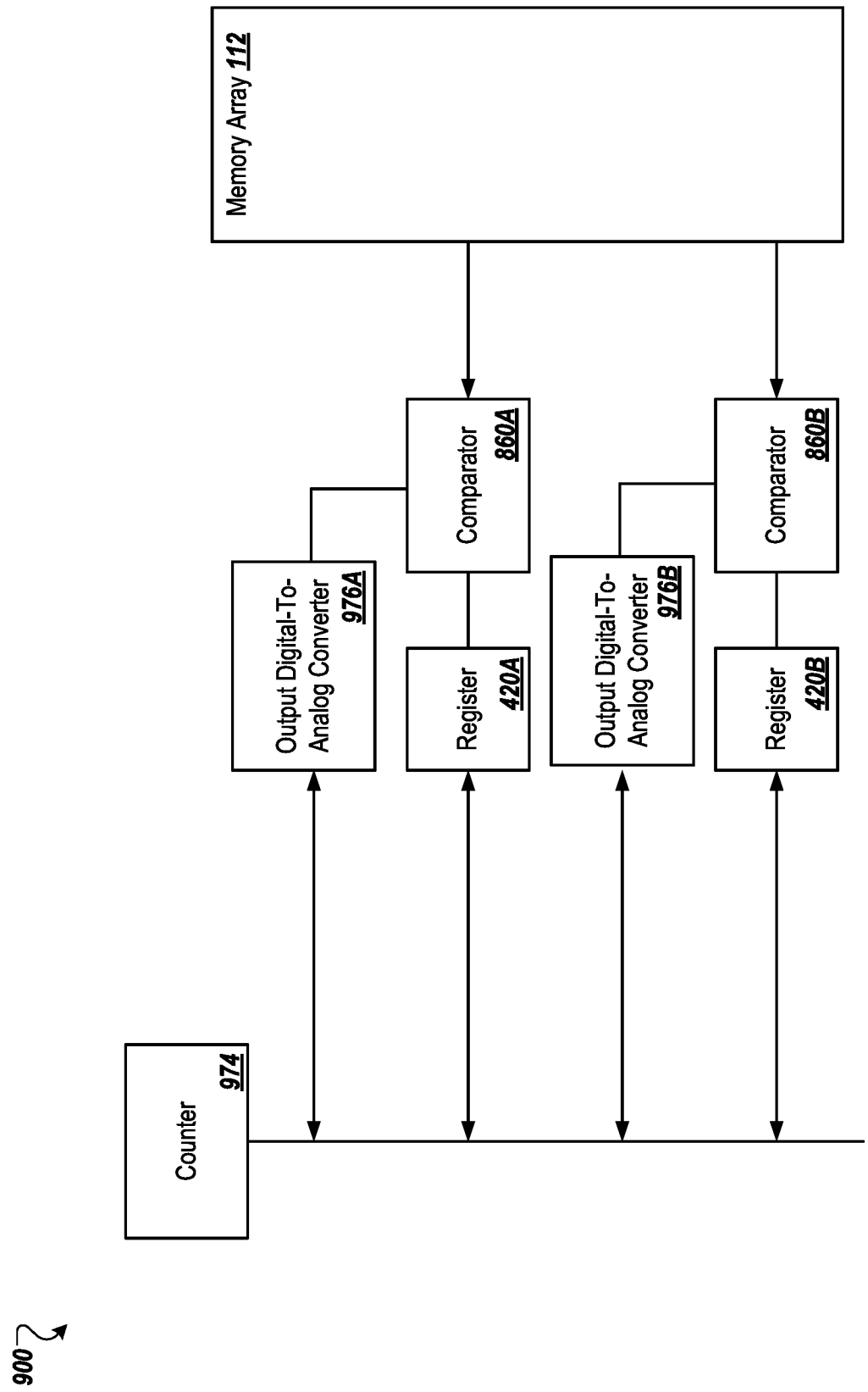
FIG. 9 illustrates an example output reading system.

FIG. 9 illustrates an example output reading system 900 that may be implemented with the memory array 112. The output reading system 900 may include a counter 974 and multiple output digital-to-analog converters 976A, 976B (referred collectively in the present disclosure as "output DACs 976" or individually as "output DAC 976").

In some embodiments, the output reading system 900 may include a separate output DAC 976 for each output line. A counter signal may generate a current signal. In some embodiments, the counter signal may be initiated at zero and may count up until it reaches a maximum number associated with a number of bits of data (e.g., for eight bits of data the maximum number includes two hundred fifty five). The output DACs 976 may receive the counter signal and generate a current signal based on the counter signal. The comparators 872 may receive the current signal based on the counter signal and the current on the corresponding rows or columns in the memory array 112. The comparators 872 may compare the two signal. When the current on the output is substantially equal to or greater than the current signal based on the counter signal, a sign of the output of the comparators 872 may change. Changing the sign of the output of the comparators 872 may trigger the registers 420. The registers 420, when triggered, may store the current signal based on the counter signal (e.g., the registers 420 may know the output current of the corresponding output in the memory array 112. In some embodiments, the resolution may be eight bits and two hundred fifty six clock cycles may be used.

In some embodiments, the output DACs 976 may include a binary weighted DAC or any other appropriate DAC circuit. Alternatively, the output DACs 976 may include the current steering DAC system 1000 illustrated in FIG. 10. In these and other embodiments, the output DACs 976 may share reference voltage circuits or reference current circuits to reduce the circuit footprint of the output reading system 900.

Modifications, additions, or omissions may be made to FIG. 9 without departing from the scope of the present disclosure. For example, the system 900 may include more or fewer elements than those illustrated and described in the present disclosure. Moreover, although described separately, in some embodiments, two or more of the counters 974 may be part of a same system or module or divided differently than described. The delineation between these and other elements in the description is not limiting and is meant to aid in understanding and explanation of the concepts and principles used in the present disclosure.

Figure 10:
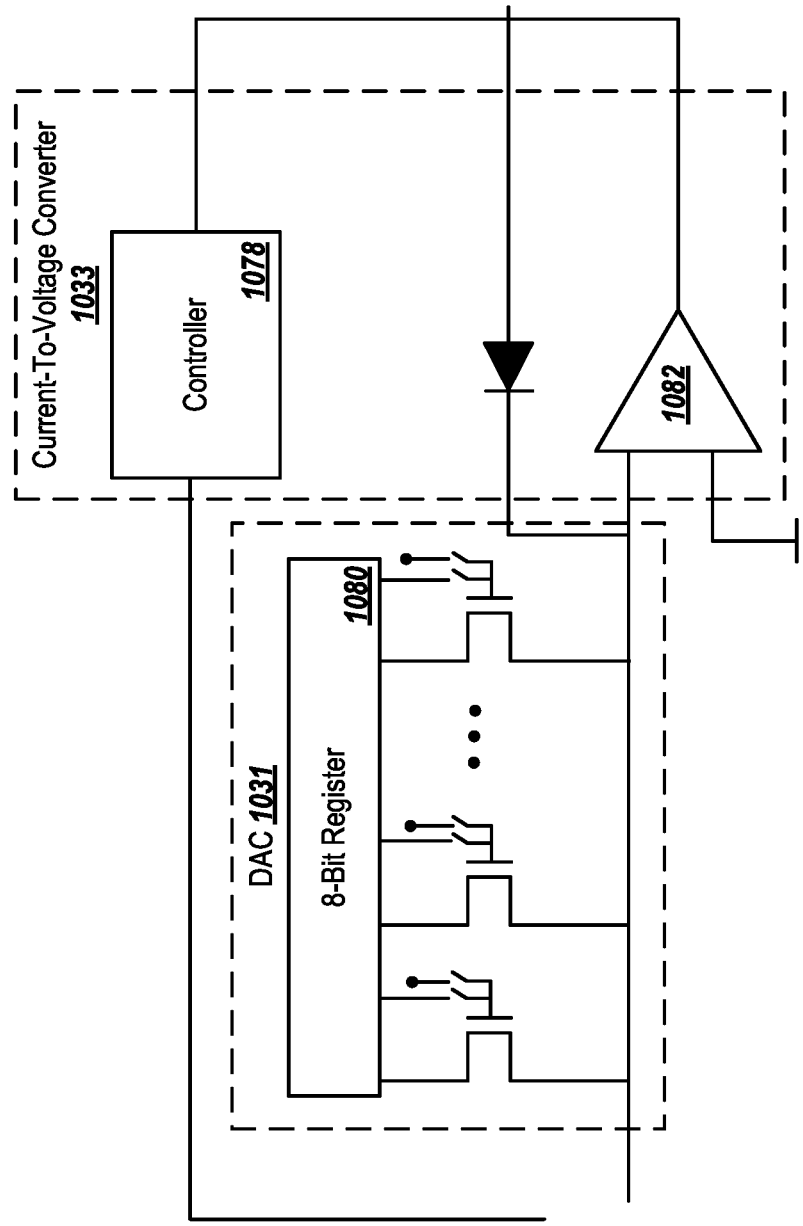
FIG. 10 illustrates an example current steering DAC system.

FIG. 10 illustrates an example current steering DAC system 1000 that may be implemented with the memory array 112. The DAC system 1000 may include a DAC 1031 and a current-to-voltage converter 1033.

Modifications, additions, or omissions may be made to FIG. 10 without departing from the scope of the present disclosure. For example, the current steering DAC system 1000 may include more or fewer elements than those illustrated and described in the present disclosure. Moreover, although described separately, in some embodiments, two or more of the controllers 1078 may be part of a same system or module or divided differently than described. In addition, although illustrated as a diode in FIG. 10, it is understand that the diode may be replaced with any appropriate device. The delineation between these and other elements in the description is not limiting and is meant to aid in understanding and explanation of the concepts and principles used in the present disclosure.

Figure 11:
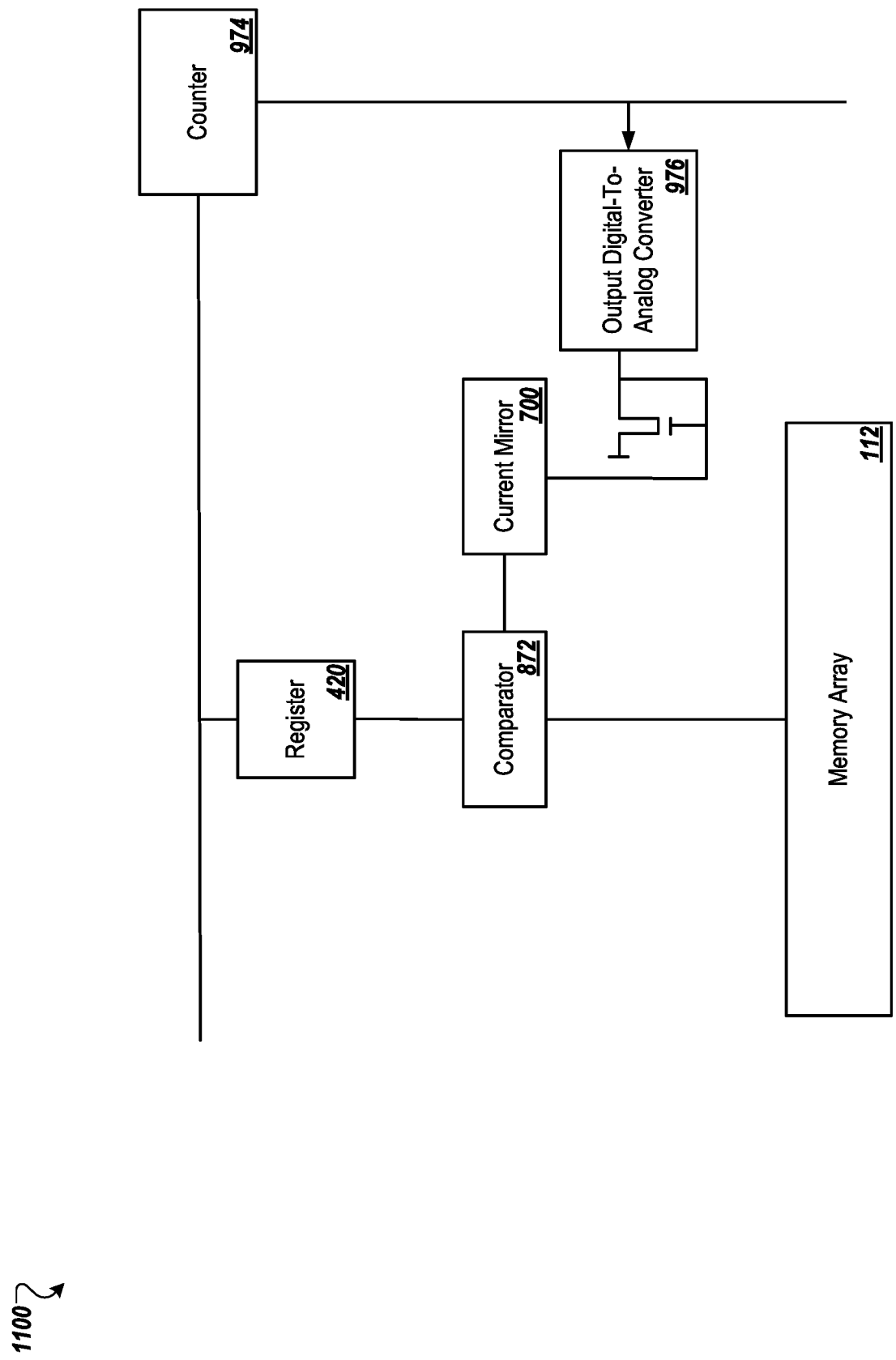
FIG. 11 illustrates another example output reading system, all in accordance with at least one embodiment described in the present disclosure.

FIG. 11 illustrates another example output reading system 1100 that may be implemented with the memory array 112. The counter 974 may generate the counter signal that is provided to the output DAC 976. The output DAC 976 may generate all possible output currents on the output lines of the memory array 112 as analog signals. The analog signals generated by the output DAC 976 may be converted to voltage signals and back to current signals by the current mirror 700. The output current signals of the current mirror 700 may be compared to the current on the corresponding device 514 in the memory array 112 by the comparator 872. If the current signal of the current mirror 700 becomes larger than the current on the corresponding devices 514 in the memory array 112, the output of the comparator may trigger the registers 420 to store the current signal based on the counter signal. The current signal stored on the registers 420 may be the result of analog-to-digital conversion of the current on the corresponding devices in the memory array 112.

Modifications, additions, or omissions may be made to FIG. 11 without departing from the scope of the present disclosure. For example, the output reading system 1100 may include more or fewer elements than those illustrated and described in the present disclosure. Moreover, although described separately, in some embodiments, two or more of the comparators 872, counters 974, registers 420, and output DACs 976 may be part of a same system or module or divided differently than described. The delineation between these and other elements in the description is not limiting and is meant to aid in understanding and explanation of the concepts and principles used in the present disclosure.

Embodiments described in the present disclosure may be implemented using computer-readable media for carrying or having computer-executable instructions or data structures stored thereon. Such computer-readable media may be any available media that may be accessed by a general purpose or special purpose computer. By way of example, and not limitation, such computer-readable media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions may include, for example, instructions and data, which cause a general purpose computer, special purpose computer, or special purpose processing device (e.g., one or more processors) to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in the present disclosure, terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B." Further, use of the term "and/or" in the present disclosure does not change this interpretation of the use of the term "or" used elsewhere in the present disclosure.

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A system comprising:
    a memory array comprising a plurality of devices;
    a digital-to-analog converter configured to convert a digital signal to an analog signal as a voltage or current signal;
    a plurality of sample and hold circuits configured to receive the analog signal and store the analog signal as a charge;
    an address controller configured to regulate which sample and hold circuits of the plurality of sample and hold circuits propagate the analog signal, the sample and hold circuits configured to feed the analog signal to the plurality of devices;
    an output circuit configured to program the plurality of devices by comparing currents of the plurality of devices to their corresponding target currents, in response to one or more of the currents of the plurality of devices being within a threshold range of the corresponding target currents, the output circuit discontinues programming the corresponding devices of the plurality of devices, in response to one or more of the currents of the plurality of devices not being within the threshold range of the target currents, the output circuit continues programming the corresponding devices of the plurality of devices;
    a counter configured to generate a counter signal;
    a plurality of output digital-to-analog converters configured to generate a plurality of current signals based on the counter signal;
    a plurality of comparators configured to receive and compare the plurality of current signals based on the counter signal and the currents of the plurality of devices, in response to one or more of the currents of the plurality of devices being within a threshold of the current signals based on the counter signal, the plurality of comparators configured to change a sign of one or more corresponding signals of a plurality of signals generated by the plurality of comparators; and
    a plurality of registers configured to receive the plurality of signals output by the plurality of comparators and in response to the sign of one or more corresponding signals of the plurality of signals output by the plurality of comparators changing, the corresponding registers of the plurality of registers store a corresponding signal of the plurality of signals output by the counter.

* * * * *